(12) United States Patent
Jain et al.

(10) Patent No.: US 6,665,627 B2
(45) Date of Patent: Dec. 16, 2003

(54) METHOD AND APPARATUS FOR EVALUATING AND CORRECTING THE TESTER DERATING FACTOR (TDF) IN A TEST ENVIRONMENT

(75) Inventors: Sunil K. Jain, Folsom, CA (US); Greg P. Chema, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 111 days.

(21) Appl. No.: 09/821,112

(22) Filed: Mar. 30, 2001

(65) Prior Publication Data

US 2002/0143486 A1 Oct. 3, 2002

(51) Int. Cl.$^7$ ............................ G06F 19/00; G01N 37/00
(52) U.S. Cl. ........................ 702/117; 702/81; 716/4
(58) Field of Search ............................ 702/57–59, 66, 702/69, 81–84, 108, 117–121, 123, 124, 126, 182, 183, 185, 189; 714/738, 742, 724

(56) References Cited

U.S. PATENT DOCUMENTS

| | | | | | |
|---|---|---|---|---|---|
| 4,791,357 | A | * | 12/1988 | Hyduke | 324/73.1 |
| 5,748,642 | A | * | 5/1998 | Lesmeister | 714/724 |
| 6,060,898 | A | * | 5/2000 | Arkin | 324/765 |
| 6,064,948 | A | * | 5/2000 | West et al. | 702/119 |
| 6,202,030 | B1 | * | 3/2001 | Hitchcock | 702/85 |
| 6,289,293 | B1 | * | 9/2001 | Huang | 702/117 |
| 6,349,267 | B1 | * | 2/2002 | Goldthorp et al. | 702/69 |
| 2002/0049554 | A1 | * | 4/2002 | Miller | 702/104 |

* cited by examiner

Primary Examiner—Marc S. Hoff
Assistant Examiner—Manuel L. Barbee
(74) Attorney, Agent, or Firm—Antonelli, Terry, Stout & Kraus, LLP

(57) ABSTRACT

Tester derating factor (TDF) arrangements and methodologies providing improvements in semiconductor start-to-finish manufacturing arrangements, especially within DV testing and in the world of designing of devices and virtual simulation.

27 Claims, 4 Drawing Sheets

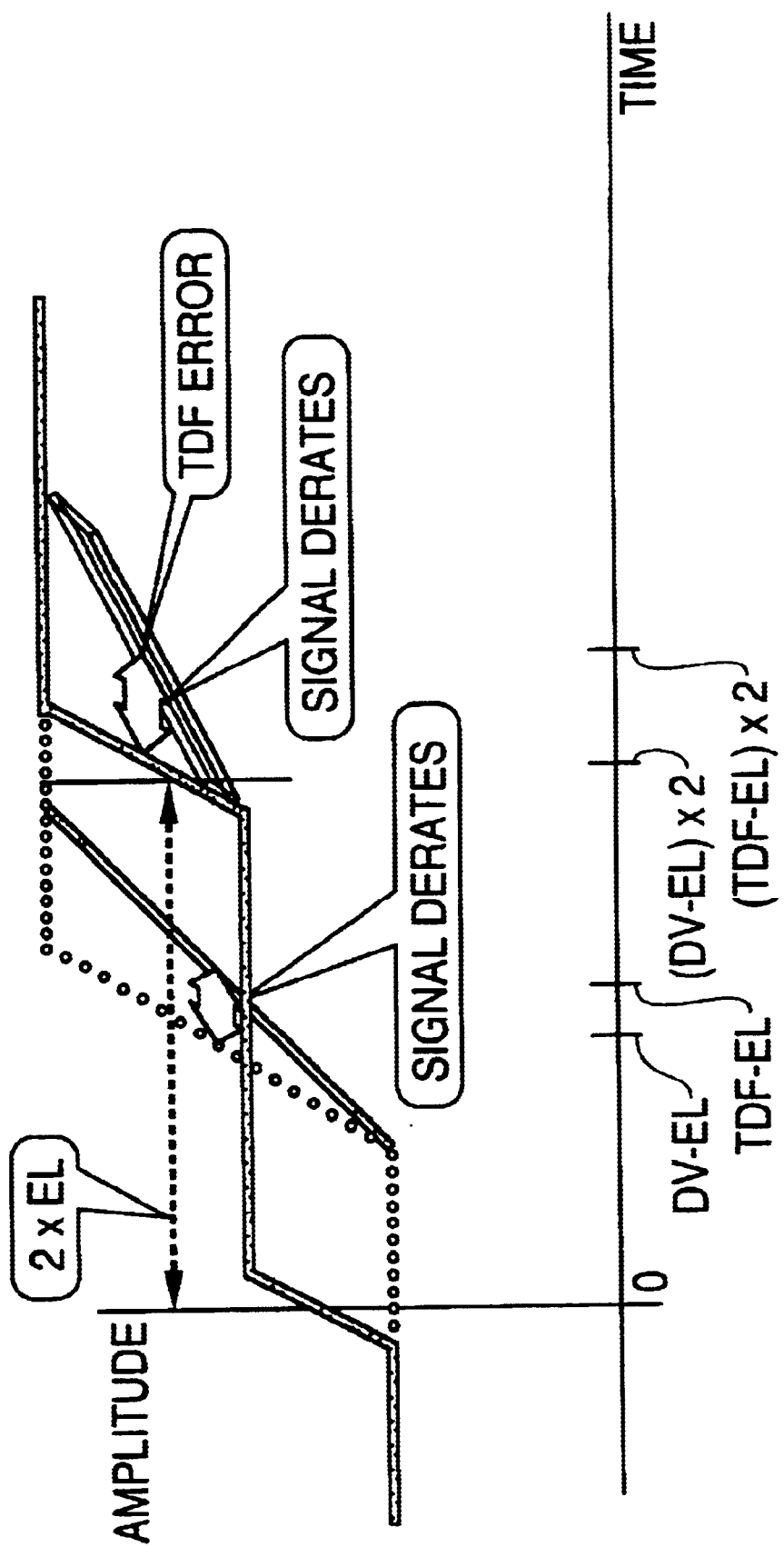

METHOD AND APPARATUS FOR EVALUATING AND CORRECTING THE TESTER DERATING FACTOR (TDF) IN A TEST ENVIRONMENT

FIELD

The present invention is directed to tester derating factor (TDF) arrangements and methodologies providing improvements in semiconductor start-to-finish manufacturing arrangements, especially within DV testing and in the world of designing of devices and virtual simulation.

BACKGROUND

Semiconductor device manufacturers often set out with a goal to design, manufacture and sell a semiconductor device which meets or provides predetermined operating characteristics, e.g., bandwidth, operating voltages, driving currents, rise/fall response times, etc. The strive toward the goal goes through at least one cycle including many stages, e.g., initially there is a virtual design stage where the device is designed virtually in computer programming and simulations (i.e., a pre-silicon stage), then there is a test production of an actual device in silicon (i.e., a post-silicon stage), followed by design validation (DV) testing of the actual post-silicon device, and finally, large volume MP and sales. While background as well as example embodiments of the present invention will be described using a pre-MP environment, uses/practice of the present invention are not limited thereto.

After virtual design and upon DV testing, DV test results often reflect that the design does not exhibit desired or expected characteristics originally designed for in the virtual design. Typically, the virtual design is then tweaked back in a design department in an attempt to adjust the device to provide desired characteristics, and then test production manufactured again and DV tested. Eventually, there is achieved a test production device with DV results having desired characteristics.

Subsequently, upon mass production, it was often found that test-run MP devices did not then provide the expected characteristics when implemented in an intended environment, e.g., when implemented on a motherboard. This often led back to further reiterations with the design department for further tweaking of the virtual design, test manufacturing, DV testing, and another test-run MP. Each reiteration of design, test manufacturing, DV testing, test-run MP and MP testing is extremely costly in terms of man hours, financial costs, and time-to-market (TtM) delays.

In order to avoid such costliness, and to minimize TtM, in the past, one technique semiconductor device manufacturers have used was to over-design semiconductor devices. For example, referencing FIG. 3, assume that a semiconductor manufacturer wishes to sell a semiconductor device which operates properly when operated within the range from A to B (for example, operated within a range from 33 MHz to 100 MHz). The manufacturer may then instead attempt to design the device to be operable within a broader range from C to D (e.g., operable between 10 MHz to 200 MHz), i.e., the broader ranges including a margin of error, i.e., "forgiving" ranges or tolerances. By over-designing the device, and then realizing MP via the present-day DV setups, manufacturers found that, although a good portion of the devices did not show characteristics within the broader C-D design range upon MP testing, a satisfactorily high manufacturing yield was achieved having the desired A-B characteristics. Accordingly, in the past, by including the over-designed C-A and B-D ranges within virtual design, manufacturers were advantageously allowed to finally net a high manufacturing A-B yield upon MP testing.

One disadvantage of the over-design approach is that it adds costs to production making the manufacturing process inefficient and resultant devices more costly. Further, oftentimes end users, knowing of over-design within the industry, purposely would use the device outside of the A-B characteristics range, to thereby make free use of the device's over-design without compensation to the semiconductor manufacturer. Accordingly, semiconductor manufacturer would sometimes fail to recoup the costs associated with over-design. Further, operation of the devices outside of the manufacturer's guaranteed ranges would sometimes lead to device failures and then an unfair negative effect on a reliability-reputation of the manufacturer.

The ability to over-design a device beyond desired characteristics is becoming a luxury of the past, and is becoming less available as operating frequencies of devices continue to increase. For example, when semiconductor devices were operated at lower operating frequencies (e.g., below 600 MHz), semiconductor circuits operated mainly in accordance with the basic E=IR Ohm's law without consideration to other effects. Now, with semiconductor devices designed for operation beyond such low operating frequencies (e.g., beyond 600 MHz, such as 1 GHz), other effects such as wave effects, transmission line effects, etc., come into play, such that forgiving ranges or tolerances are no longer viable. In addition, previous industry reliance on the over-design approach has led to some complacency with regard to improvements in the industry. More particularly, it has been found that there has not been adequate improvement within DV testing setups, in comparison to advances in other areas of the semiconductor device industry. Accordingly, what is needed are improvements in semiconductor start-to-finish manufacturing arrangements, and especially within DV testing, and in the world of virtual designing of devices.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein:

FIG. 6 is a block diagram illustration of a simplistic virtual DV and oscilloscope test setup useful in explanation of example virtual tester derating factor (TDF) embodiments of the present invention.

DETAILED DESCRIPTION

Figure 1:
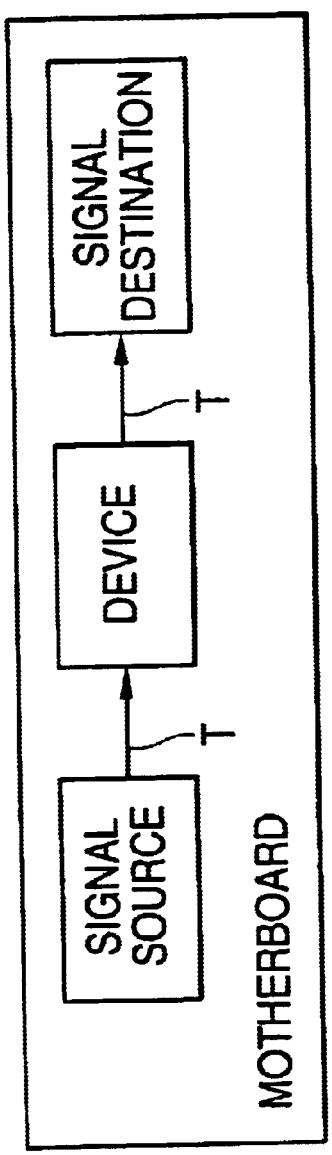
FIG. 1 is a block diagram illustration of a simplistic example motherboard environment useful in an explanation of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Still further, the clock and timing signal FIGS. are not drawn to scale, and instead, exemplary and critical time values are mentioned when appropriate. As a further note, well known power/ground connections to ICs and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits, flowcharts) are set forth in order to describe example embodiments of the invention, it should be apparent to one skilled in the art that the invention can be practiced without, or with variation of, these specific details. Finally, it should be apparent that differing combinations of hard-wired circuitry and software instructions can be used to implement embodiments of the present invention, i.e., the present invention is not limited to any specific combination of hardware and software.

Figure 2:
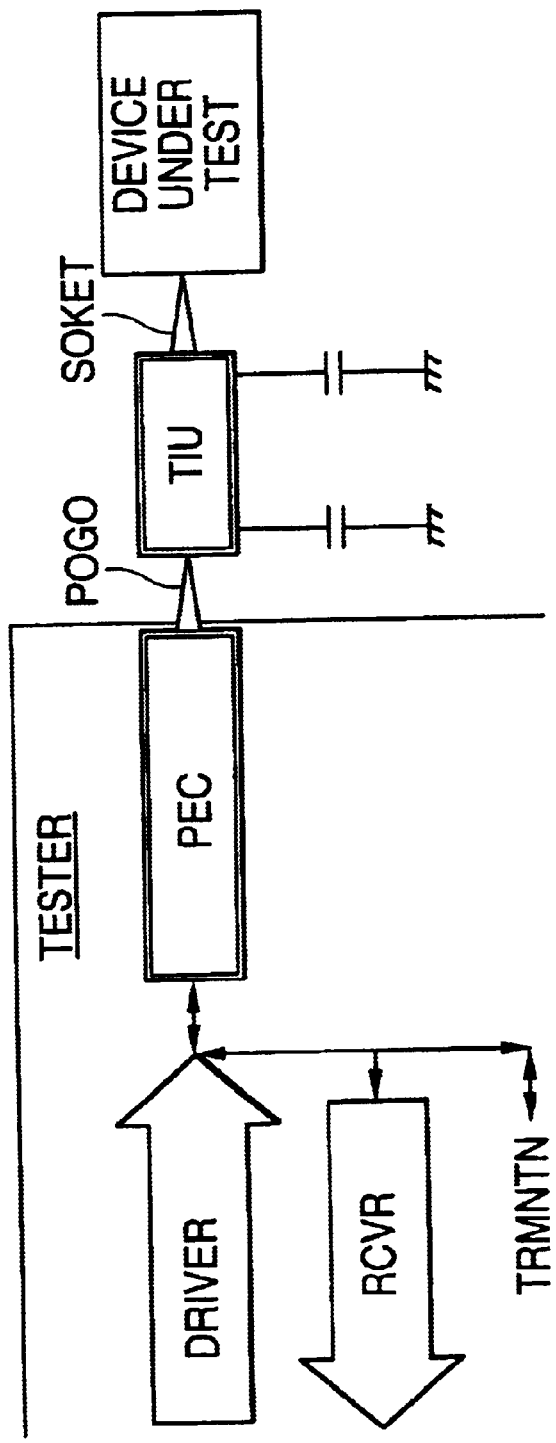
FIG. 2 is a block diagram illustration of a simplistic DV test setup useful in explanation of example embodiments of the present invention.
Figure 3:
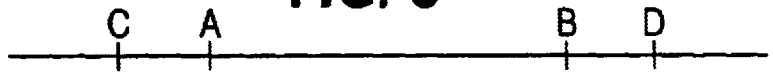
FIG. 3 is an example illustration of a range of characteristics designed for in a semiconductor device manufacturing process.

The following represents a convenient listing of some, if not all, acronyms used within the present disclosure:
DUT—device under test
DV—design validation
MP—mass production
TDR—tester derating factor
ATE—automatic test equipment
HVM—high volume manufacturing
PEC—pin electronics card
TDR—time domain reflectometry
TIU—tester interface unit
EPA—edge placement accuracy Turning now to detailed description, as mentioned previously, DV testing is one stage encountered in semiconductor device manufacturing. One example DV testing setup useful in an example explanation of the invention is as shown in FIG. 2. More particularly, shown is a tester connected to a tester interface unit (TIU) via a pogo pin (e.g., a spring-loaded pogo pin), which is connected to a device under test (DUT) via a socket pin. The DUT typically has a plurality of pins, e.g., 256 or 512 pins, and accordingly, a corresponding number of interconnection channels are set up between the tester and DUT to allow tests with respect to each pin. The tester may include a driver (DRIVER), receiver (RCVR), termination (TRMNTN) and pin electronics card (PEC) for each channel. In viewing FIG. 2, it should be understood that only one channel to the DUT is illustrated, and that other channels would have similar arrangements.

With regard to operation during testing, if a particular channel is connected to a DUT pin serving an input function to the DUT, the tester DRIVER of that channel is operable, whereas if a particular channel is connected to a DUT pin serving an output function from the DUT, the tester RCVR is operable. The example DV testing setup may be later used during MP testing to test large volume MP devices, or alternatively, a differing MP testing setup may be used.

As mentioned previously in the background section, often there are discrepancies between DV test results and results obtained in a final implementation environment (e.g., when the device is implemented on a motherboard). In research directed toward the present invention, a goal was set out to find the causes behind DV and final-implementation discrepancies, and to see whether understanding of such discrepancies could lead to ways to better streamline start-to-finish manufacturing. That is, the present inventors set out to determine whether such causes could be eliminated or reduced, or otherwise accounted for, so as to improve start-to-finish manufacturing. In research, a number of situations contributing to discrepancies were found, and such hindsight knowledge is now used to describe several disadvantageous situations in the next several sections to follow.

For a first situation, one problem has been found to be an inconsistency between environments, i.e., an inconsistency between operation of the device within the testing environment as opposed to operation within a final implementation environment. More particularly, if any device is operated within a first environment (e.g., within a first circuit or system) having its own set of particulars (e.g., impedances, voltage and current levels, trace lengths), that same device will operate differently in a second environment having a second or differing set of particulars. As mentioned previously, in setting out with the initial goal of designing a device meeting predetermined characteristics, a semiconductor device is mainly designed for operation within an anticipated implementation environment, such as being mounted to, and operated on, a motherboard. FIG. 1 illustrates an example such implementation, i.e., a simplistic illustration of a motherboard environment having a device receiving a signal along a trace T from drivers of a signal source (e.g., a differing device), and then driving (i.e., outputting) a signal via a trace T to a signal destination (e.g., another differing device). Again, only a single channel is shown for simplicity of illustration. The motherboard typically will have known or designed particulars, for example, particulars which comply with an accepted industry specification or standard. For example, such industry specification or standard may require close spacings between discrete semiconductor devices (e.g., chips), with trace lines T of known impedances, known drivers from interconnected chips, etc. In contrast, a DV testing setup is a completely differing environment having a completely differing set of particulars, i.e., different circuits having different components, impedances, inter-device spacings, traces, etc. As but one important example, a device will interface with different buffers (typically which a much higher load) in a DV environment, as opposed to a final implementation environment. It was found that such environmental differences contribute to a DV test setup shortcomings and should be taken into account when trying to improve DV results.

Focus next is on the tester. One tester situation that may represent a limitation on DV testing, is inherent limitations of the tester itself. More particularly, the tester is typically a commercially-available device which is designed and built at some point in time with then-available components and devices. Then the tester is subsequently used to test next (i.e., future) generation components and devices. Accordingly, by being designed and built with prior generation components/devices, the tester by nature may have operating limitations (e.g., operating characteristics) which are inferior to those of next generation components and devices. For example, a next generation device (i.e., DUT) might have a higher operating frequency, quicker response buffers and times, etc., than the prior generation devices making up the tester. In research directed toward the present invention, it was found that such tester limitations contribute to a DV test setup shortcomings and should be taken into account when trying to improve DV results.

Yet another tester situation which was found that should be taken into account for DV test setup improvement, is a circuit model for each tester channel. That is, since the circuit environment in which a DUT is operated in will affect the operation of the DUT and thus the DV test results (i.e., response, shape, amplitude, etc., of test signals being handled), the circuit model for each tester channel should be taken into account. One problem is that testers generally are manufactured and sold by specialized tester manufacturers (e.g., Hewlett-Packard). Such tester manufacturers are generally very reluctant to disclose circuit models or detailed particulars with respect to tester channels, out of fear that competitors will use such information for competitive advantage such as building testers without research cost.

One way around the reluctant disclosure problem is for a semiconductor manufacturer to sign a non-disclosure-agreement (NDA) and/or non-competitive agreement in exchange for the tester manufacturer releasing tester circuit channel models for the tester. Alternatively, a tester's channel models can be obtained in at least two differing (i.e., non-exhaustive) ways. First, each respective tester can be subjected to testing in an otherwise known DV environment so as to reverse determine channel circuit models. Second, tester manufacturers can be required by a contracting/purchasing semiconductor manufacturer to provide testers having specific (e.g., desired) channel circuit models for each channel.

Another tester situation which may contribute to shortcomings is unrealistic tester calibration. More particularly, testers are typically provided from manufacturers as having the differing channels thereof having calibration guaranteed up to the output of the PEC. More particularly, each tester channel includes adjustment arrangements (not shown) such that the differing channels can be calibrated with respect to one other, such that the differing channels provide operations which are closely similar or calibrated to one another. For example, using time domain reflectometry (TDR), a signal can be sent out on all tester channels so as to be reflected back by the open-ends at the opposing ends of the tester channels, the reflected signals compared with respect to timing, and then signal delay may be added or subtracted from various channels such that all outputs (e.g., signal output) from the differing channels are adjusted to arrive at the output point of the PEC at substantially the same time. A problem is that such tester calibration is that calibration is basically unrealistically made with respect to (i.e., only up to) the output points of the PEC, and not in a real-world DV environment or setup. That is, in real-world use of the tester, for one thing, there additionally are pogo pins at the output points of the differing channels, i.e., beyond the PEC, and tester calibration does not take into account lengths of such pogo pins.

With respect to pogo pin lengths, it is highly likely that the pogo pins for the differing channels will be compressed to differing lengths when physically interfaced to (i.e., compressively contacted by) the TIU. Accordingly, even if the tester is perfectly calibrated at the PEC end of the pogo pin, the calibration will become imperfect at the opposing TIU end of the pogo pin if a TIU is installed after tester calibration. Accordingly, just like the aforementioned tester limitations which contributes to shortcomings, compressed pogo pin length differences also should be taken into account in DV test setup improvement.

In continuing to move from the tester toward the DUT, next focus is on the TIU or load board. Since the tester is not designed for any specific DUT and differing DUTs may have differing pin-outs or other requirements, the TIU provides necessary customized interfacing between the tester and DUT. As but one example, the TIU may be a printed circuit board having pogo-pin interface pads, conductive traces, possibly support circuitry (e.g., drivers, repeaters) and a DUT-mountable socket, all serving to provide proper channel interconnections between ones of the tester channels and corresponding pins or other input structures of the DUT. In research aimed toward the present invention, several problems were found with the TIU.

First, unequal lengths exist between many if not all TIU channels (when comparing the differing TIU channels with one another). Accordingly, the TIU's unequal channel lengths further contribute to mis-calibration of signals to one another in time as the signals move from the tester to DUT and back. Further, it was found that TIUs are manufactured under somewhat loose specifications such that trace widths, spacings, impedances, etc., varied significantly from TIU-to-TIU, from conductive-line-trace-to-conductive-line-trace on a same TIU, and even along a length of a single conductive line trace.

Just like for tester channel circuit models, it was found that TIU channel circuit variances should likewise be taken into account for DV test setup improvement. That is, since the circuit environment in which a DUT is operated in will affect the operation of the DUT and thus the DV test results, the circuit model for each TIU channel should be taken into account. A TIU channel model can be obtained in at least two differing (i.e., non-exhaustive) ways. First, each respective TIU can be subjected to testing in an otherwise known DV environment so as to reverse determine TIU channel circuit models. Second, TIU manufacturers can be required by a contracting/purchasing semiconductor manufacturer to provide TIU's having specific (e.g., desired) TIU channel circuit models for each channel.

Moving discussion to another DV test setup situation which may contribute to DV test shortcomings, TIU setup calibration (like the aforementioned tester calibration) may be incomplete in not taking into account conductive lengths within the DUT-receiving socket as well as within the DUT. More particularly, if the TIU setup is open-circuit calibrated where DUT-receiving socket conductive lengths are left electrically "hanging" (i.e., unconnected to the DUT), such calibration may not take into account a proper conductive lengths of the socket which lengths may differ from one another when the DUT is actually inserted therein, i.e., each DUT pins may make electrical contact at different point of the socket conductive length. Further, within the DUT, there will be different internal pin-to-silicon routing for each pin, i.e., respective pins might be at different distances from the silicon die therein, and might have to be attached to different locations on the silicon die. Accordingly, even if the TIU setup is perfectly calibrated at the TIU end of the DUT-receiving socket conductive lengths, the calibration will become imperfect at the opposing end of the DUT-receiving socket conductive lengths and/or at the DUT silicon die.

Accordingly, DUT-receiving socket conductive lengths and DUT internal pin-to-silicon conductive lengths also should be taken into account for improvement in DV test setup. One approach to improving DUT-receiving socket conductive length consideration, is to perform TIU setup calibration with either ground or known terminations at the opposing DUT end of the DUT-receiving socket conductive lengths, such that the DUT-receiving socket conductive lengths are not left hanging during calibration.

Still additional situations which were found that should be taken into account for DV test setup improvement are "soft" connections within the DV testing setup. That is, in an intended use environment such as a motherboard, typically devices/components are soldered in place or at the very least, pressure locked into a socket (e.g., a locking zero-insertion-force (ZIF) socket). Such are "hard" connections in that they provide solid, constant connections. In contrast, within the DV testing setup, the pogo-pin-to-TIU connection and the DUT-to-socket connection provide looser, sometimes-varying connections. Soldered tester-to-TIU connections are not practical within a DV testing setup because TIUs are often changed with respect to the tester, so the "soft" pogo-pin-to-TIU connection connections are a necessary evil. Similarly, soldered DUT-to-TIU connections are not practical because a significant plurality of DUTs may be swapped into and out of the DV testing setup during DV testing, and thus the socket must provide quick swapping.

The result of all of the aforementioned situations and shortcomings, is unrealistic or inaccurate DV testing results being reported at a tester end. More particularly, all of the foregoing will cause the tester at one end of a channel to see and report a differing (i.e., derated) signal or data as opposed to an actual signal or data appearing at the other end of the channel at the DUT pin. That is, all of the forgoing situations and shortcomings, as well as wave effects and transmission line effects which occur at higher (e.g., 600+ MHz) frequencies will cause signals or data to derate (i.e., distort or change) as it travels the channels between the tester and DUT pins. In trying to improve and further streamline DV test setup and start-to-finish manufacturing operations, there has been developed the concept of a tester derating factor (TDF). A TDF is either a numerical value or some type of mathematical expression which can be applied to a particular tester's DV test result to obtain at least a close approximation of a corresponding test result which would occur if measured actually at the DUT pin. For example, whereas a particular channel for a DUT pin might show signal characteristics satisfactory within a range from 50 MHz to 150 MHz when reported from a tester end, signal characteristics might actually show satisfactory results within a range from 33 MHz to 200 MHz at a DUT pin end of the channel.

As one use, the TDF, once determined, can be used to translate the DV test result obtained at the tester end to a test result which is probably occurring at the DUT pin end of the channel. If the translated DUT pin end test result shows characteristics which would be unacceptable within the manufacturer's device goals at the output pins of the DUT, such can be immediately reported to the design department for further tweaking, rather than having to verify the same unacceptable DUT pin results. Such serves to further streamline start-to-finish manufacturing (i.e., improve TtM), as well as reduce production costs associated with design and manufacture of the device.

Some aspects should be understood with respect to TDF. First, there may be many TDFs associated with any DV test setup, each differing TDF will be associated with a differing part of the DV test setup. For example, each channel or pin sub-categories may have its own TDF. Further, differing TDFs may be determined for differing locations along a same channel existing from tester to the DUT, i.e., if you are trying to translate a result from point A to point B, a first TDF would be applicable, whereas if you are trying to translate a result from point C to point B, a differing TDF would be applicable as differing circuits, impedances, etc., would have been incurred so as to derate the result in a different way. Such should become more apparent as a better understanding of the invention is obtained in further reading of this disclosure.

Figure 5:
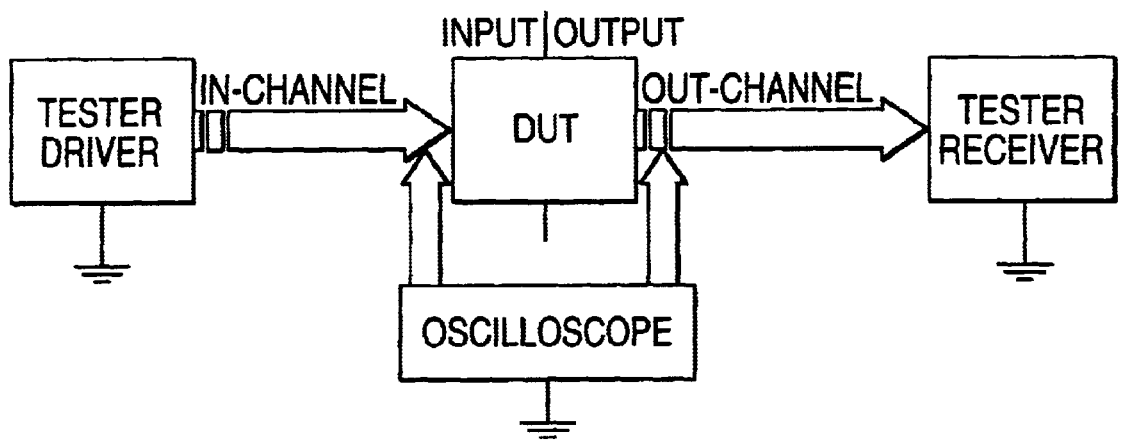
FIG. 5 is a block diagram illustration of a simplistic DV and oscilloscope test setup useful in explanation of example tester derating factor (TDF) embodiments of the present invention.
Figure 7:
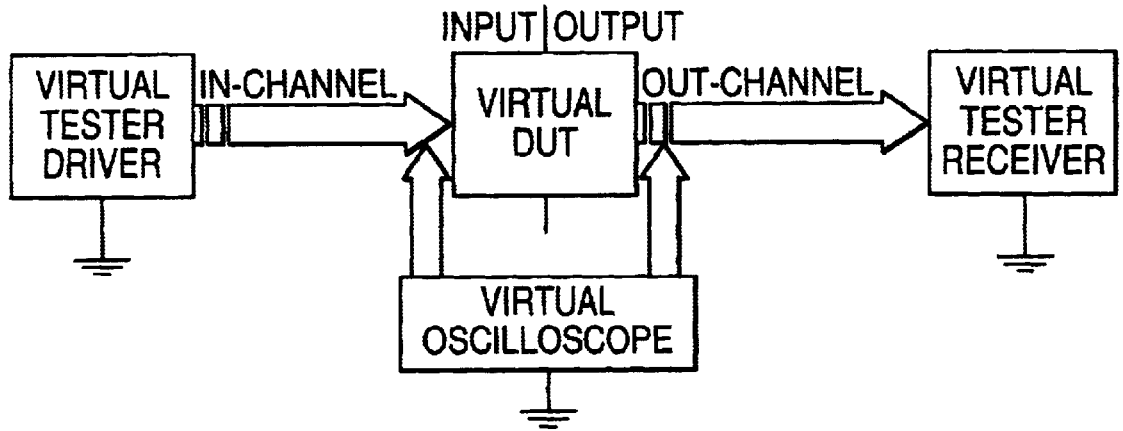
FIG. 7 is a block diagram illustration of a virtual DV and virtual oscilloscope test setup useful in explanation of example tester derating factor (TDF) embodiments of the present invention.
Figure 4:
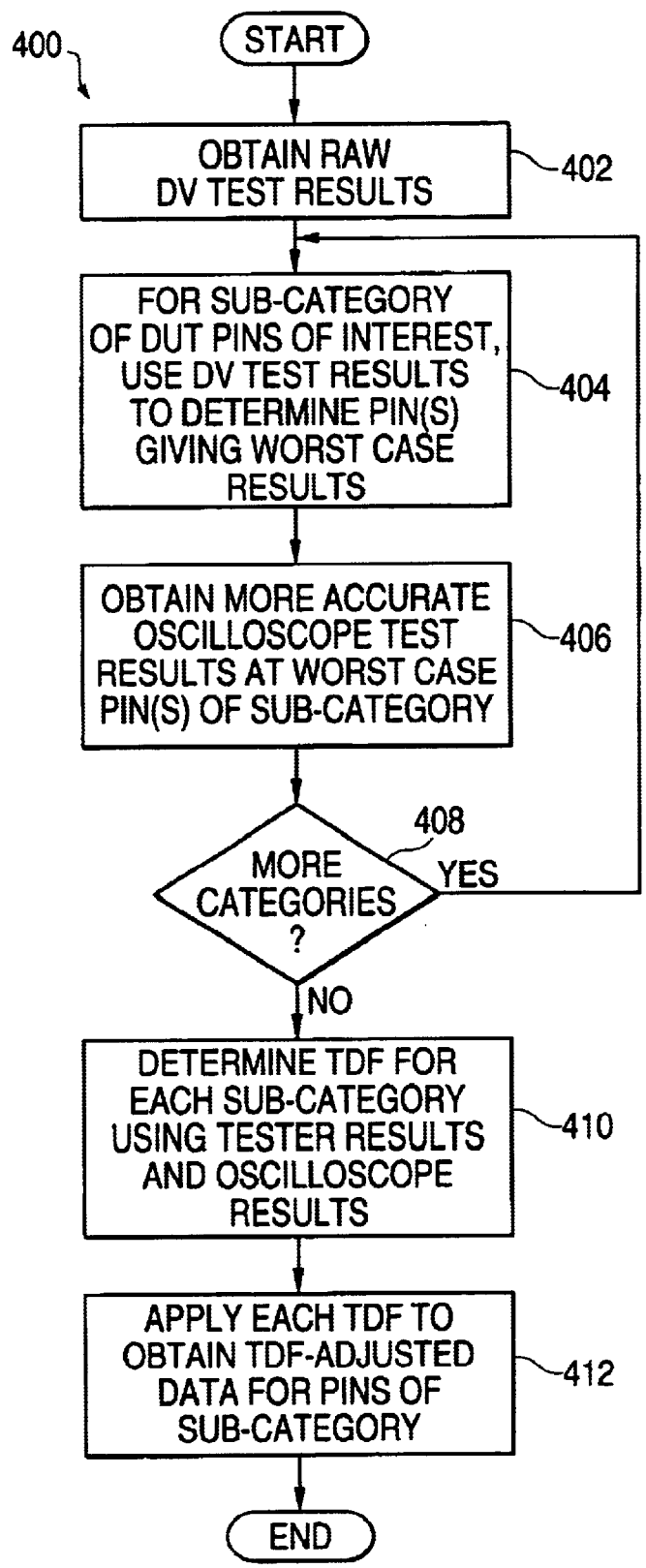
FIG. 4 is an example flow useful in explanation of example embodiments of the present invention.

Discussion turns now to one example experimental setup and method to determine a TDF, and also to an example flow illustrated in FIG. 4. First, a generic DV test is run so as to obtain raw DV test results (block 402) for all or at least a portion of the DUT pins of interest. Each DUT will have many pins, and such pins typically can be subdivided into several sub-categories of pins, e.g., front-side-bus (FSB) pins, graphics input/output pins, etc. For a sub-category of pins of interest, e.g., for FSB pins, the initial DV test results are analyzed to determine (block 404) which pin or pins (hereinafter "pin(s)") which gave the worst case (or best case) DV test results at the tester end. Next, as shown in the example FIG. 5 set up, one would connect up an oscilloscope to the worst case DUT pin(s) of that category, and re-perform the test cycle in an attempt to sample more accurate DV test results. That is, whereas the tester tests across the tester end of the channel to ground, the FIG. 5 oscilloscope setup will test at the actual DUT pin(s) to ground. The FIG. 5 illustrated oscilloscope is a dual channel oscilloscope such that two differing pins/channels can be tested at a same time, e.g., an input pin/channel and an output pin/channel. The oscilloscope typically is already available within DV labs so no additional equipment cost is incurred, and generally, DV test personnel have familiarity with the oscilloscope and the oscilloscope has a greater accuracy than the tester.

By connecting up directly to, and measuring directly at, the DUT, the oscilloscope determines much more accurate data than does the tester. That is, by inserting a higher accuracy instrument (oscilloscope) at the DV setup location (i.e., DUT pin or pins) where data has not substantially subjected to distortion (derating) due to influences (e.g., impedance effects, wave effects, transmission line effects), one can obtain much more accurate DV data (block 406) than at the tester end. Stated differently, the oscilloscope measures signals at the threshold to the DUT, rather than at some other DV setup location where the signal will have undergone influences or distortions as mentioned previously.

In returning to the FIG. 4 flow discussion, in block 408, if there are more DUT pin sub-categories of interest, the foregoing operations with respect to blocks 404–406 are repeated to obtain more accurate oscilloscope test data for worst case pin(s) for each sub-category.

The difference between the oscilloscope data and tester data is substantially representative of the tester error (i.e., error in the tester being able to derive accurate test data remotely from the DUT pins and in having inherent limited tester accuracy). Such difference can be then boiled down (block 410) into a numerical value and be used as a "tester derating factor" (TDF). It should be noted that while the present example embodiment is described as only sampling worst case (or best case) pin(s), additional procedures could be applied to obtain a TDF with respect to each and every DUT pin, but such comprehensive approach may be too costly in terms of man-hours and expense in that the DV test would then be effectively performed by hand (as opposed to automation or semi-automation). Accordingly, oscilloscope testing, in the present example embodiment, is only performed on the above-described worst case (or best case) pin(s) sampling basis for each subcategory of pins.

The TDFs for differing sub-categories most likely are different from one another, which is one reason why they are separately determined and applied. That is, while a 512 pin DUT may have 4, 6 or 8 types of pin categories, e.g., hub-links, advanced graphics pins (AGP), peripheral component interface (PCI) bus pins, FSB, etc. (where each category has its own electrical specifications, buffers, drivers, etc.), the corresponding TDF is determined for each type.

Once a TDF is obtained for the worst case pin(s), such TDF can then be applied (block 412) to the tester data from other pins/channels of the same category so as to translate the imperfect original tester DV data into more accurate TDF-DV data. For example, if the TDF had been determined for a worst case FSB pin, the TDF can be applied to tester data relating to other FSB pins to obtain TDF-adjusted data for each of the FSB pins. The TDF-adjusted data represents more accurate test data which should be occurring at the DUT pins as opposed to what was being originally measured and reported at the tester end. Such more realistic DUT pin data is much more probative and predictive of whether a DUT will provide satisfactory characteristics when implemented in an intended (e.g., motherboard) environment, and should help speed the start-to-finish manufacturing processes.

The TDFs can be determined in numerous differing ways. More particularly, discussion turns to three example methods or techniques, although practice of the present invention is not limited to these three methods. To summarize, there will be discussed a Tco (time-clock-to-out) method, Rise-Time method, and Electrical-Length method.

Turning now to a discussion of the Tco method, the FIG. 5 tester and oscilloscope setup are both used to determine Tco test results at the tester and at the DUT pin(s), respectively. More particularly, a signal is fired from the tester driver into the DV setup toward the DUT to provoke a response signal from the DUT, an incident time thereof is recorded, and then an arrival time of the response signal back at the tester is recorded, and then the tester takes into account several factors (e.g., electrical length delays from test-to-DUT and back) to arrive at a "Tco reported by the tester". The DUT-connected oscilloscope is subsequently used to make a more accurate determination of the Tco. More particularly, an incident time of the signal as is actually arrives at the DUT is recorded, then the actual time of the response signal being output by the DUT is recorded, and are used to arrive at a "Tco at DUT balls". Then, a TDF with respect to such test results are determined from the formula given by: TDF=Delta between 'Tco reported by Tester' to 'Tco at DUT balls, by oscilloscopy'.

Turning next to a Rise-Time method (or alternatively, a Fall-Time method), a little background theory is in order. In a cascaded linear system, each of the cascaded stages will have a field velocity change and thus cause a rise-time or fall-time variance in the signal. Variance occurs because the phase constant of each stage is different, so each response time will be different. Convolution theorem dictates that variances of the cascaded stages get added up. An example Rise-Time method embodiment of the present invention makes use of a transmission line effect where if a line is open or has a major impedance discontinuity at a termination end thereof, at least a portion of any signal will be reflected back. Accordingly, a signal will get derated (i.e., gain rise-time (or fall-time) variance) as it travels into a cascaded system, and upon hitting a the discontinuous or open termination end, at least a portion of the signal will get reflected back and get further derated. According to the convolution theorem, at the output of the cascaded linear system, the square of the rise time is a very good approximation of the variance.

FIG. 6 is a useful illustration of rise-time variance which may be incurred in a signal sent into, and reflected back from the termination end of, a cascaded linear DV test setup system. Within FIG. 6, a horizontal axis represents a time axis, whereas a vertical axis represents an amplitude axis. A thick solid line, for the purposes of this Rise-Time discussion illustrates the rise in time which a tester end theoretically might expect to see with respect to a test signal over time. More particularly, at a reference time t=0, a test signal having the rise-time represented graphically by the left-hand thick solid slant line may be fired out of the tester DRIVER and into a remainder of the linear DV system. The tester would at a subsequent time, detect the reflected signal which may be represented theoretically (without distortion) by the right-hand thick solid slant line. However, in practice, as mentioned above, the signal gains rise-time (or fall-time) variance as the signal travels through the linear system. As a result, rather than the reflected signal having the rise time of a slant represented the right-hand thick solid slant line, the actual rise-time slant would have a differing rise-time or fall-time as represented by one of the FIG. 5 right-hand thin solid slant lines. The reason that a plurality of right-hand thin solid slant lines are shown is because pins of differing sub-categories might incur different rise-time (or fall-time) variances, so a range of differing slants is shown.

The rise-time (or fall-time) derated signal will have information therein as to the derating as well as the termination it encountered in the system. That is, the derated signal can be used to determine the TDF. In this instance, the same FIG. 5 oscilloscope testing setup can be used, and this time would be used to look at rise-time or fall-time (as opposed to the Tco) of the signal for the worst (or best) case DUT pin(s). Since a DUT has signals in opposing directions (e.g., incoming input signals and outgoing output signals), it is recommended that the rise-times or fall-times be looked at, and TDFs be determined, in both input and output directions. That is, using the FIG. 5 multiple channel oscilloscope, on pins/channels where the tester is serving as a signal source which is input to the DUT, shoot a signal from the tester into the system and use the tester's oscilloscope and a first channel of the DUT-positioned oscilloscope to look at the rise-time or fall-time of the signal at the tester end and DUT end of DV input channel, respectively. In contrast, on pins/channels where the DUT is serving as a signal source which is output back to the tester, shoot a signal from the DUT toward the tester and use the second channel of the DUT-positioned oscilloscope and tester's oscilloscope to look at the rise-time or fall-time of the signal at the DUT end and tester end of the DV output channel, respectively. Once measurements are taken, the TDF can be determined from the following formula: TDF=Delta between the DUT-end wave rise time verses the tester-end wave rise time, i.e., computation may be made using the convolution property equation.

As an alternative, results using a single oscilloscope in each direction may be used. That is, steps to follow: let the tester shoot a signal toward the device; observe the incident wave and observe the reflected wave on the tester oscilloscope at the tester end of the system; next, shoot a signal from the DUT toward the tester, observe the incident wave and observe the reflected wave at the oscilloscope at the DUT end. Each direction measurement should show a different result because the terminations at the opposing ends (i.e., the tester end and the DUT end) are different. The path between the ends will be the same, so that will be a known factor. TDF=Delta between the reflected wave rise time verses incident wave rise time, i.e., compute using the convolution property equation.

Discussion finally turns to an electrical length method. Such method is based upon a same phase velocity and phase constant approach as is the Rise-Time (of Fall-Time) method. The bottom line with the electrical length method is how much time does it take a signal to travel from point A to point B, and how much derating occurs during that time. Some initial background discussion is in order, and such will be made again using FIG. 6.

For purposes of electrical length method discussions, assume in FIG. 6 that the thick solid line is a calibration signal initially injected into the system by the tester to determine and store an electrical length value. More particularly, at time t=0, the left-hand thick solid slant line represents the rise of the incident signal entering the tester end of the DV setup, and the right-hand thick solid slant line represents the rise of the reflected signal emerging back out of the tester end of the DV setup. The tester may be programmed to automatically perform such an electrical length test at a time of calibration, whereupon it monitors for and determines the time between the incident signal and the reflected signal (illustrated by the short-dashed line designated 2×EL in FIG. 6). The tester divides this time by two to determine what the tester assumes is the electrical length or time it takes a signal to leave the tester and arrive at the DUT end of the system (designated by horizontal point DV-EL in FIG. 6). That is, the tester, for example, looks at the length between a 50% point of the incident wave to a 50% point of the reflected wave, divides that by two to arrive at a perceived electrical length. The tester then stores this DV-EL value in some known register or file, and subsequently uses this DV-EL value in subsequent DV testing and calculations.

The problem as mentioned somewhat previously, is that tester calibration such as DV-EL calibration typically is the basis for all tester calibration, and disadvantageously is performed without the DUT mounted in the test setup, such that an erroneous EL is determined, stored and then used to erroneously affect DV testing results. That is, errors occur because the calibration EL (which does not take into account the DUT's EL) is different from the actual electrical length during DV/DUT testing. Note that the erroneous calibration EL is one of the reasons why 'Tco reported by Tester' is erroneous, i.e., the tester utilizes the erroneous calibration EL in the determination thereof.

Accordingly, in this instance, the oscilloscope can be used to look at and determine more accurate ELs between the tester and the worst (or best) case DUT pin(s). That is, using the FIG. 5 two channel oscilloscope, on pins/channels where the tester is serving as a signal source which is input to the DUT, shoot a signal from the tester into the system and use one channel of the oscilloscope to exactly time the incident signal entering the tester-end of the DV setup, and the other channel of the oscilloscope to exactly time the signal arriving at the DUT. On pins/channels where the DUT is serving as a signal source which is directed back toward the tester, shoot a signal from the DUT toward the tester and use one channel of the oscilloscope to exactly time the signal leaving the DUT, and the other channel of the oscilloscope to exactly time the signal arriving at the tester. Once measurements are taken, the TDF can be determined from the following formula: TDF=Delta between the accurate-measured EL verses the tester-calibration EL.

As an alternative, results using a single oscilloscope in each direction may be used. That is, steps to follow: unlike normal tester calibration, install an actual DUT for a termination; let the tester shoot a signal to the DUT; observe the incident wave and observe the reflected wave on the tester oscilloscope at the tester-end of the system; next, shoot a signal from the DUT toward the tester, observe the incident wave and observe the reflected wave at the oscilloscope at the DUT-end. Again, TDF=Delta between the accurate-measured EL verses the tester-calibration EL.

With respect to application of these and other TDF-determination methods to various DUT pins, some DUT pins or subcategories might be versatile in that all methods may be useable therewith, whereas other pins or subcategories may be less versatile such that a lesser number of methods may be useable. When multiple methods are useable for a given pin/channel category to determine a TDF, test personnel can chose to apply any one or multiple ones of the methods to determine TDF. Using multiple ones of the methods to redundantly determine TDF using differing methods is advantageous in that the differing determined TDFs can then be cross-compared for consistency as a measure of accuracy. If the differing determined TDFs match or are within a predetermined acceptable range from each other, such may represent proof that a determined TDF is accurate. Alternatively, if differing determined TDFs vary significantly from each other, such may be an indication of an error in TDF determination, whereupon redetermination is recommended until a consistent TDF is achieved.

In conclusion, TDF quantifies and can be used to eliminate a substantial portion of the errors in tester reported DV data, and greatly improve DV accuracy. TDF helps bridge the gap between tester and motherboard; eliminates calibration limitations, saves debug time, effort and resources; speeds TtM. As further summary, TDF is a methodology which uses a number of differing techniques to evaluate the errors due to tester derating, and to correct for the derated errors. TDF methodologies further help focus on error areas of design and testing, and facilitate feedback back to design as to what changes are required in order to get a better design and, ultimately, a better device and manufacturing yield. Such TDF methodologies can be implemented in DV tester software, and thus can be embedded in (i.e., designed into) future DV tester generations or even in present upgradeable DV testers. Alternatively, TDF methodology software can distributed/sold separately, or be provided and run on stand-alone computing apparatus separate from the DV test setup. Finally, the methodologies can be used to improve tester calibrations, DV test setup components, and DV test results. Using TDF methodologies, existing DV testers useful life can be extended beyond that which was possible previously, e.g., by using TDF methodologies to account for error, EPA of the tester can be improved.

In addition to the real post-silicon DV testing world, TDF methodologies may have further value if applied within the pre-silicon virtual design/testing world. More particularly, in virtual design of a semiconductor device, a circuit model of that device is known and can be simulated. If additional models (such as those discussed above in a beginning portion of this Detailed Discussion section) of an anticipated DV test setup components are known, then DV testing can also be simulated using the collaboration of all of the models. That is, computer simulation can be used to predict how the ultimately test-run MP device will behave during testing in a actual DV test setup. Further, by simulating and comparing test result from various locations within the DV test simulation (e.g., from a tester-end and DUT-end), predictions can be made as to what types of TDF would be expected for differing aspects of the actual DV test setup. Accordingly, for virtual simulation, there is a need to have models for all portions of the anticipated DV setup. More particularly, a non-exhaustive listing of typical models that would be required for virtual DV simulation and virtual TDF calculation are: tester model (including models for tester PEC, driver, receiver, diode clamps, terminations (active or in-load), pogo pins (compressed and uncompressed); TIU model (including PCB components, traces, spacings; shared, non-shared and DTL); DUT socket model, with and without contact elements; DUT model (including package, internal wiring lengths and I/O buffer models); termination impedance models (including changes from calibration to DV testing); oscilloscope probe model for the oscilloscope which will be used in actual TDF methodologies. Virtual DFT determinations or predictions are made by accomplishing the above-described (or other) DFT methodologies in a virtual way with respect to the modeled DV setup. Knowledge from such simulations can then be used to improve the design stage, in that designers can design for testability (DFT).

While prediction is very helpful, pre-silicon virtual simulation results will not exactly match post-silicon actual results, because modeling will not be perfect. For example, pre-silicon results might indicate a buffer characterization of 700 psec, whereas post-silicon results might show an actual 500 psec. Because real DV world measurements do not always match the simulations, some empirical measurements typically will be required. With corrections and improvements to models over time and experience, virtual design, virtual DV testing, virtual TDF prediction and TDF should greatly improve. Correspondingly, start-to-finish manufacturing processes will improve.

Accordingly, it should be apparent to those skilled in the art, that all the TDF methodologies of the present invention, as well as all of the claimed invention, may be practiced in the pre-silicon design world and virtual simulation.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

For example, it was previously mentioned that while the background as well as example embodiments of the present invention were described using a pre-mass-production environment, uses or practice of the present invention are not limited thereto. Non-exhaustive examples of other uses of arrangements of the present invention are with a subsequent MP testing setup, or with Testoscopy.

What is claimed is:

1. A tester derating factor (TDF) arrangement, comprising:
   a design validation (DV) setup including a DV tester to obtain DV testing data for plurality of pins of a device under test (DUT);
   a second tester to obtain more accurate testing data for at least one selected pin of the DUT, at a position which is less electrically remote from the DUT than the DV tester;
   a TDF determination arrangement to determine a TDF for the at least one selected pin using at least one difference between the DV testing data and the more accurate testing data, for use to adjust DV testing data of ones of the plurality of pins which are analogous in type to the at least one selected pin, to TDF-adjusted DV data by applying the TDF thereto.

2. A TDF arrangement as claimed in claim 1, further comprising:
   an adjusting arrangement to adjust DV testing data of the ones of the plurality of pins which are analogous in type to the at least one selected pin, to the TDF-adjusted DV data by applying the TDF thereto.

3. A TDF arrangement as claimed in claim 2:
   wherein the DV tester is to obtain at least one of Tco (time-clock-to-out), Rise-Time, Fall-Time and Electrical-Length DV testing data;
   wherein the second tester is to obtain corresponding more accurate ones of Tco, Rise-Time, Fall-Time and Electrical-Length DV testing data for the at least one selected pin; and
   wherein the TDF determination arrangement is to determine corresponding ones of a Tco-based TDF, a Rise-Time-based TDF, a Fall-Time-based TDF and an Electrical-Length-based TDF for the at least one selected pin using at least one difference between the Tco, Rise-Time, Fall-Time and Electrical-Length DV testing data, and the more accurate Tco, Rise-Time, Fall-Time and Electrical-Length DV testing data; and
   where the adjusting arrangement is to adjust Tco, Rise-Time, Fall-Time and Electrical-Length DV testing data of ones of the plurality of pins which are analogous in type to the at least one selected pin, to TDF-adjusted DV data by applying the Tco-based TDF, Rise-Time-based TDF, Fall-Time-based TDF and Electrical-Length-based TDF, respectively, thereto.

4. A TDF arrangement as claimed in claim 3:
   wherein plural ones of the Tco-based TDF, Rise-Time-based TDF, Fall-Time-based TDF and Electrical-Length-based TDF are determined, and compared with one another as a measure of accuracy of the determined TDFs.

5. A TDF arrangement as claimed in claim 1, wherein the second tester obtains the more accurate testing data at the at least one selected pin of the DUT.

6. A TDF arrangement as claimed in claim 1, wherein the second tester is an oscilloscope having a higher tester accuracy than the DV tester.

7. A TDF arrangement as claimed in claim 1, wherein at least one of the TDF determination arrangement and the adjusting arrangement are incorporated as part of the DV tester.

8. A TDF arrangement as claimed in claim 1, wherein at least one of the TDF determination arrangement and the adjusting arrangement are software operable on at least one of the DV tester, the second tester, and a stand-alone processing apparatus.

9. A design validation (DV) system having a tester derating factor (TDF) arrangement, comprising:
a design validation (DV) setup including a DV tester to obtain DV testing data for plurality of pins of a device under test (DUT);
a second tester to obtain more accurate testing data for at least one selected pin of the DUT, at a position which is less electrically remote from the DUT than the DV tester;
a TDF determination arrangement to determine a TDF for the at least one selected pin using at least one difference between the DV testing data and the more accurate testing data, for use to adjust DV testing data of ones of the plurality of pins which are analogous in type to the at least one selected pin, to TDF-adjusted DV data by applying the TDF thereto.

10. A system as claimed in claim 9, further comprising:
an adjusting arrangement to adjust DV testing data of the ones of the plurality of pins which are analogous in type to the at least one selected pin, to the TDF-adjusted DV data by applying the TDF thereto.

11. A system as claimed in claim 10:
wherein the DV tester is to obtain at least one of Tco (time-clock-to-out), Rise-Time, Fall-Time and Electrical-Length DV testing data;
wherein the second tester is to obtain corresponding more accurate ones of Tco, Rise-Time, Fall-Time and Electrical-Length DV testing data for the at least one selected pin; and
wherein the TDF determination arrangement is to determine corresponding ones of a Tco-based TDF, a Rise-Time-based TDF, a Fall-Time-based TDF and an Electrical-Length-based TDF for the at least one selected pin using at least one difference between the Tco, Rise-Time, Fall-Time and Electrical-Length DV testing data, and the more accurate Tco, Rise-Time, Fall-Time and Electrical-Length DV testing data; and
where the adjusting arrangement is to adjust Tco, Rise-Time, Fall-Time and Electrical-Length DV testing data of ones of the plurality of pins which are analogous in type to the at least one selected pin, to TDF-adjusted DV data by applying the Tco-based TDF, Rise-Time-based TDF, Fall-Time-based TDF and Electrical-Length-based TDF, respectively, thereto.

12. A system as claimed in claim 11:
wherein plural ones of the Tco-based TDF, Rise-Time-based TDF, Fall-Time-based TDF and Electrical-Length-based TDF are determined, and compared with one another as a measure of accuracy of the determined TDFs.

13. A system as claimed in claim 9, wherein the second tester obtains the more accurate testing data at the at least one selected pin of the DUT.

14. A system as claimed in claim 9, wherein the second tester is an oscilloscope having a higher tester accuracy than the DV tester.

15. A system as claimed in claim 9, wherein at least one of the TDF determination arrangement and the adjusting arrangement are incorporated as part of the DV tester.

16. A system as claimed in claim 9, wherein at least one of the TDF determination arrangement and the adjusting arrangement are software operable on at least one of the DV tester, the second tester, and a stand-alone processing apparatus.

17. A tester derating factor (TDF) method, comprising:
using a design validation (DV) setup including a DV tester to obtain DV testing data for plurality of pins of a device under test (DUT);
using a second tester to obtain more accurate testing data for at least one selected pin of the DUT, at a position which is less electrically remote from the DUT than the DV tester;
using a TDF determination arrangement to determine a TDF for the at least one selected pin using at least one difference between the DV testing data and the more accurate testing data, for use to adjust DV testing data of ones of the plurality of pins which are analogous in type to the at least one selected pin, to TDF-adjusted DV data by applying the TDF thereto.

18. A method as claimed in claim 17, further comprising:
using an adjusting arrangement to adjust DV testing data of the ones of the plurality of pins which are analogous in type to the at least one selected pin, to the TDF-adjusted DV data by applying the TDF thereto.

19. A method as claimed in claim 18:
wherein the DV tester is used to obtain at least one of Tco (time-clock-to-out), Rise-Time, Fall-Time and Electrical-Length DV testing data;
wherein the second tester is used to obtain corresponding more accurate ones of Tco, Rise-Time, Fall-Time and Electrical-Length DV testing data for the at least one selected pin; and
wherein the TDF determination arrangement is used to determine corresponding ones of a Tco-based TDF, a Rise-Time-based TDF, a Fall-Time-based TDF and an Electrical-Length-based TDF for the at least one selected pin using at least one difference between the Tco, Rise-Time, Fall-Time and Electrical-Length DV testing data, and the more accurate Tco, Rise-Time, Fall-Time and Electrical-Length DV testing data; and
where the adjusting arrangement is used to adjust Tco, Rise-Time, Fall-Time and Electrical-Length DV testing data of ones of the plurality of pins which are analogous in type to the at least one selected pin, to TDF-adjusted DV data by applying the Tco-based TDF, Rise-Time-based TDF, Fall-Time-based TDF and Electrical-Length-based TDF, respectively, thereto.

20. A method as claimed in claim 19:
wherein plural ones of the Tco-based TDF, Rise-Time-based TDF, Fall-Time-based TDF and Electrical-Length-based TDF are determined, and compared with one another as a measure of accuracy of the determined TDFs.

21. A method as claimed in claim 17, wherein the second tester obtains the more accurate testing data at the at least one selected pin of the DUT.

22. A method as claimed in claim 17, wherein the second tester is an oscilloscope having a higher tester accuracy than the DV tester.

23. A method as claimed in claim 17, wherein at least one of the TDF determination arrangement and the adjusting arrangement are incorporated as part of the DV tester.

24. A method as claimed in claim 17, wherein at least one of the TDF determination arrangement and the adjusting arrangement are software operable on at least one of the DV tester, the second tester, and a stand-alone processing apparatus.

25. Tester derating factor (TDF) software provided on a tangible medium, said software comprising an arrangement capable of running operations of:

accepting at least a portion of design validation (DV) testing data for plurality of pins of a device under test (DUT), as determined using a design validation (DV) setup including a DV tester;

accepting more accurate testing data for at least one selected pin of the DUT, as was determined at a position which is less electrically remote from the DUT than the DV tester using a second tester;

using a TDF determination arrangement to determine a TDF for the at least one selected pin using at least one difference between the DV testing data and the more accurate testing data, for use to adjust DV testing data of ones of the plurality of pins which are analogous in type to the at least one selected pin, to TDF-adjusted DV data by applying the TDF thereto.

26. Software as claimed in claim 25, said software comprising an arrangement capable of running operations of:

using an adjusting arrangement to adjust the DV testing data of the ones of the plurality of pins which are analogous in type to the at least one selected pin, to the TDF-adjusted DV data by applying the TDF thereto.

27. Software as claimed in claim 25:

wherein the DV testing data is at least one of Tco (time-clock-to-out), Rise-Time, Fall-Time and Electrical-Length DV testing data;

wherein the more accurate testing data are more accurate ones of Tco, Rise-Time, Fall-Time and Electrical-Length DV testing data for the at least one selected pin; and wherein the TDF determination is used to determine corresponding ones of a Tco-based TDF, a Rise-Time-based TDF, a Fall-Time-based TDF and an Electrical-Length-based TDF for the at least one selected pin using at least one difference between the Tco, Rise-Time, Fall-Time and Electrical-Length DV testing data, and the more accurate Tco, Rise-Time, Fall-Time and Electrical-Length DV testing data; and where the adjusting is used to adjust Tco, Rise-Time, Fall-Time and Electrical-Length DV testing data of ones of the plurality of pins which are analogous in type to the at least one selected pin, to TDF-adjusted DV data by applying the Tco-based TDF, Rise-Time-based TDF, Fall-Time-based TDF and Electrical-Length-based TDF, respectively, thereto.

* * * * *